Figure 1A:
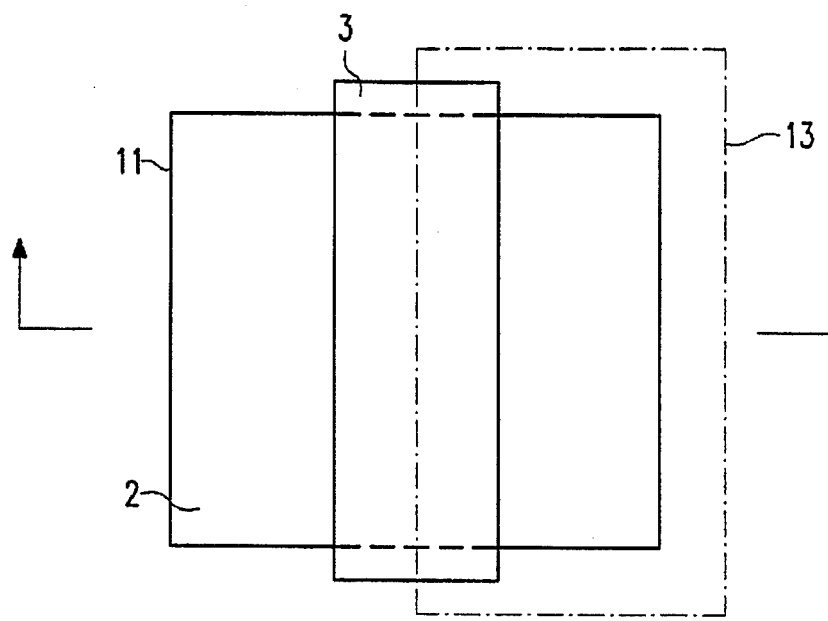

United States Patent
Maas et al.

[11] Patent Number: 5,629,554
[45] Date of Patent: May 13, 1997

[54] SEMICONDUCTOR DEVICE WITH A BIPOLAR TRANSISTOR FORMED IN A LAYER OF SEMICONDUCTOR MATERIAL PROVIDED ON AN INSULATING SUBSTRATE

[75] Inventors: Henricus G. R. Maas; Ronald Dekker; Armand Pruijmboom, all of Eindhoven, Netherlands

[73] Assignee: U.S. Philips Corporation, New York, N.Y.

[21] Appl. No.: 637,012

[22] Filed: Apr. 24, 1996

Related U.S. Application Data

[63] Continuation of Ser. No. 402,401, Mar. 9, 1995, abandoned, which is a continuation of Ser. No. 221,125, Mar. 31, 1994, abandoned.

[30] Foreign Application Priority Data

Apr. 8, 1993 [EP] European Pat. Off. ............. 93201045

[51] Int. Cl.⁶ .................... H01L 27/082; H01L 27/102; H01L 29/70; H01L 31/11
[52] U.S. Cl. .................... 257/586; 257/587; 257/588
[58] Field of Search .................... 257/586, 587, 257/588

[56] References Cited

FOREIGN PATENT DOCUMENTS

| | | |
|---|---|---|
| 2159727 | 6/1990 | Japan . |
| 2198727 | 7/1990 | Japan . |

*Primary Examiner*—Stephen Meier
*Attorney, Agent, or Firm*—Daniel E. Tierney

[57] ABSTRACT

A semiconductor device with a bipolar transistor formed in a layer of semiconductor material (2) provided on an insulating substrate (1), in which material a collector zone (4), a base zone (5), and an emitter zone (6) are provided below a strip of insulating material (3) situated on the layer (2), which zones are connected to contact regions (7, 8, 9, 10) lying adjacent the strip (3), three of the contact regions (8, 9, 10) lying next to one another at a same side of the strip (3), of which two (8 and 9) are connected to the base zone (5) while the third (10), which lies between the former two (8 and 9), is connected to the emitter zone (6). The three contact regions (8, 9, 10) situated next to another at the same side of the strip (3) are provided alternately in the layer of semiconductor material (2) and in a further layer of semiconductor material (19) extending up to the strip (3). The three contact regions (8, 9, 10) connected to the base zone (5) and the emitter zone (6) may be provided with mutual interspacings which are smaller than the details which can be realised in a photoresist layer by means of the photolithographic process to be used in the manufacture of the transistor. As a result, the transistor can be manufactured with a very small extrinsic base.

10 Claims, 4 Drawing Sheets

SEMICONDUCTOR DEVICE WITH A BIPOLAR TRANSISTOR FORMED IN A LAYER OF SEMICONDUCTOR MATERIAL PROVIDED ON AN INSULATING SUBSTRATE

This is a continuation of application Ser. No. 08/402,401, filed Mar. 9, 1995 now abandoned which was a continuation of Ser. No. 08/221,125, filed Mar. 31, 1994 now abandoned.

The invention relates to a semiconductor device with a bipolar transistor formed in a layer of semiconductor material provided on an insulating substrate, in which material a collector zone, a base zone, and an emitter zone are provided below a strip of insulating material situated on the layer, which zones are connected to contact regions situated adjacent the strip, three contact regions lying next to one another at a same side of the strip, two of which are connected to the base zone while the third is arranged between the former two and is connected to the emitter zone.

The insulating substrate may be a glass plate here, or a slice of semiconductor material provided with a layer of insulating material such as, for example, a silicon slice coated with a silicon oxide layer. The layer of semiconductor material may be a layer of monocrystalline or polycrystalline semiconductor material. When a layer of monocrystalline silicon is provided on an insulating substrate, this is called an SOI structure (Silicon On Insulator structure).

Such a device, which in practice may comprise a large number of such transistors, is particularly suitable for use in battery-fed portable communication equipment. The transistors may have very small dimensions. As a result, they have a very small emitter, a very small extrinsic base, a very small collector drift region, and a very small base-collector and emitter-base capacitance. Owing to the use of the SOI structure and the small dimensions, moreover, the capacitance between the collector zone and the substrate is very low. These transistors as a result exhibit a high current amplification at low collector currents already, also for high signal frequencies.

BACKGROUND OF THE INVENTION

The English Abstract of Japanese Patent Application no. 2-159727 discloses a semiconductor device with a bipolar transistor of the kind mentioned in the opening paragraph in which the collector, base, and emitter zones are connected to contact regions situated adjacent the strip and provided in the layer of semiconductor material present on the substrate.

In the manufacture of this known bipolar transistor, the strip of insulating material is first provided on the layer of semiconductor material. The portion of the layer of semiconductor material situated below the strip forms the collector zone of the transistor. Then the base zone is formed in that a p-type dopant is provided at one side of the strip, and in that subsequently a heat treatment is carried out whereby p-type dopant diffuses into the portion of the layer of semiconductor material situated below the strip, forming a base-collector junction them. Then three strip-shaped regions are formed in the layer of semiconductor material at the same side of the strip, the layer of semiconductor material being removed between the strip-shaped regions up to the strip of insulating material. The outermost regions are provided with an extra quantity of p-type dopant, whereby the two base contact regions are formed. Then an n-type dopant is provided in the central region and a heat treatment is carded out. N-type dopant diffuses as a result from the central region into the base zone. The emitter zone and an emitter-base junction are thus formed in the base zone. The central n-type doped region itself forms the emitter contact region.

The transistor thus formed has an intrinsic base formed by that portion of the base zone which is situated between the base-collector junction and the emitter-base junction. Between the intrinsic base and the contact regions, the base zone forms a narrow, extrinsic base situated below the strip of insulating material. The extrinsic base forms an undesired resistance. This resistance is as small as possible when the extrinsic base is as small as possible. This is the case when the mutual interspacings between the three contact regions are as small as possible.

The three strip-shaped regions situated at one side of the strip of insulating material are formed in the layer of semiconductor material by means of a photolithographic process in the known bipolar transistor. After a photoresist mask has been provided, defining these regions, portions of the layer of semiconductor material not covered by this mask are etched away. It is true for a photolithographic process that details smaller than a critical dimension valid for that process cannot be pictured in the photoresist. The three contact regions, accordingly, cannot be realised with interspacings smaller than the critical dimension. In a practical, modem lithographic process, this critical dimension is, for example, 0.5 µm.

SUMMARY OF THE INVENTION

The invention has for its object inter alia to construct the bipolar transistor of the kind mentioned in the opening paragraph in such a manner that the interspacings between the three contact regions connected to the transistor base and emitter zones can be smaller than the critical dimension of the photolithographic process used during manufacture, so that the transistor has a comparatively small extrinsic base.

According to the invention, the transistor is for this purpose characterized in that the three contact regions situated next to one another at the same side of the strip are provided alternately in the layer of semiconductor material and in a further layer of semiconductor material extending up to the strip.

The contact regions connected to the base and emitter zones can then be manufactured in two photolithographic process steps. In a first process step, a first pattern is provided in the layer of semiconductor material present on the substrate. Then the further layer of semiconductor material is deposited, and a second pattern is provided therein during the second process step. If the first pattern comprises the base contact regions, the second pattern comprises the emitter contact region. If the first pattern comprises the emitter contact region, the second pattern comprises the base contact regions. The contact regions are thus provided alternately in the layer of semiconductor material present on the substrate and in the further layer of semiconductor material.

In the second photolithographic process step, a photoresist mask is provided which is aligned relative to the first pattern realised during the first process step. This can be done with an alignment tolerance which is much smaller than the critical dimension. In the photolithographic process referred to above, with which details of 0.5 µm can be realised in photoresist, this alignment tolerance in practice is approximately 0.1 µm. Whereas the interspacings between the contact regions in the known device described was, for example, 0.5 µm, it is no more than 0.1 µm in the device according to the invention. The extrinsic base of the transistor is thus considerably smaller than that of the known transistor described.

As was noted above for the three contact regions, the contact regions connected to the base zone or the contact region connected to the emitter zone may be provided in the layer of semiconductor material present on the insulating substrate. The respective other contact region or regions is or are then provided in the further layer of semiconductor material. Preferably, however, according to the invention, the contact regions connected to the base zone are provided in the layer of semiconductor material present on the substrate and the contact region connected to the emitter zone is provided in the further layer of semiconductor material.

In this preferred embodiment of the transistor, the emitter zone is formed through lateral diffusion of atoms of a dopant from the further layer of semiconductor material into the layer of semiconductor material provided on the substrate. An emitter-base junction can be realised thereby which is situated in the base zone over only a very small distance, while nevertheless a very efficient emitter is obtained. This high efficiency is obtained because the layer of semiconductor material provided on the substrate merges into the further layer of semiconductor material very close to the emitter-base junction.

The contact region connected to the collector zone may be formed in the layer of semiconductor material provided on the insulating substrate or in the further layer of semiconductor material. Preferably, according to the invention, the contact region connected to the collector is provided in the layer of semiconductor material at the other side of the strip of insulating material opposite the contact region connected to the emitter zone. The strip of insulating material may then be provided on the layer of semiconductor material to a width which is equal to the critical dimension mentioned above which can be realised by means of the lithographic process used. A transistor is formed thereby with a minimum collector drift region. If the contact region connected to the collector zone were provided in the further layer of semiconductor material, it could not be positioned so favorably. The contact regions connected to the collector zone and to the emitter zone would then have to lie at a distance from one another which is at least equal to this critical dimension. The strip of insulating material would then have to be wider than this critical dimension. If the critical dimension is 0.5 µm, as indicated above, and the alignment tolerance 0.1 µm, the strip would have to be 0.5 µm in the former case and 0.7 µm in the latter case.

BRIEF DESCRIPTION OF THE DRAWING FIGURES

Figure 5A:
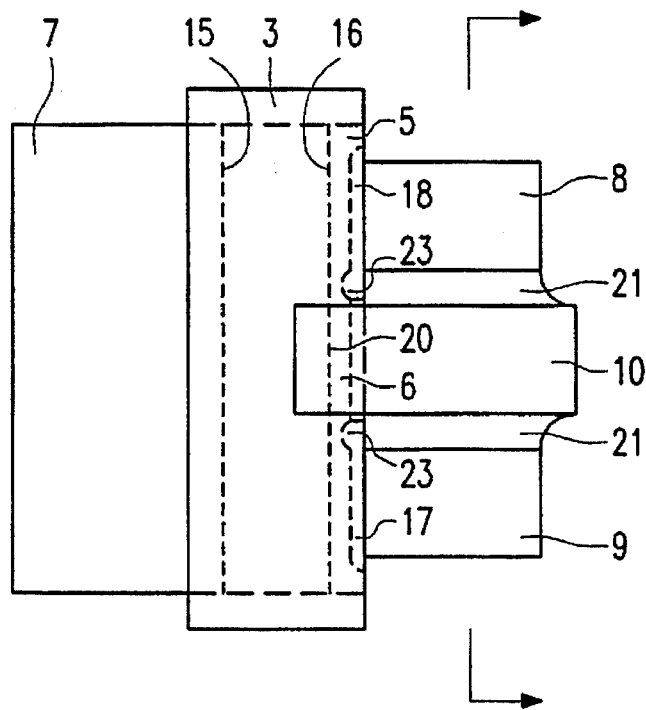
Figure 5B:
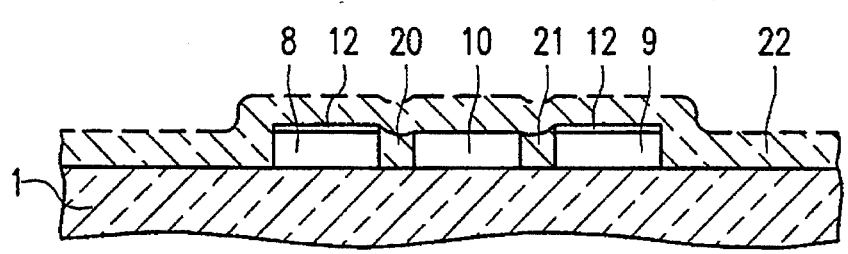
Figure 6:
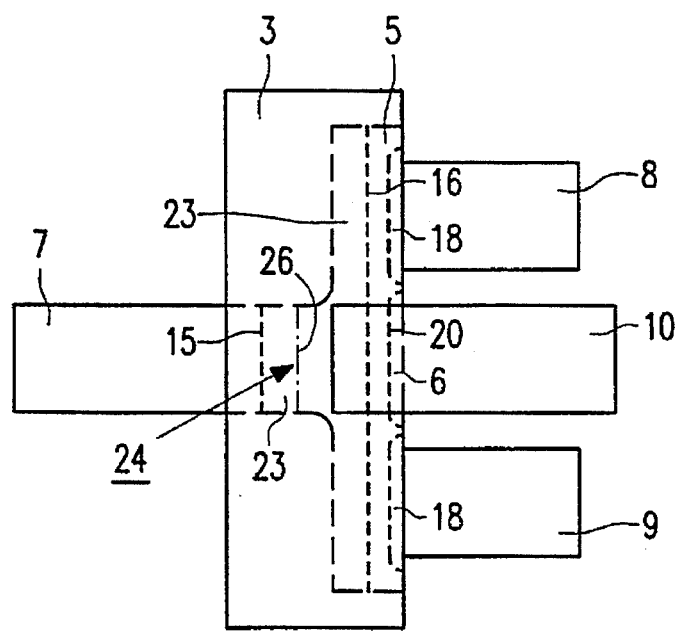
Figure 7:
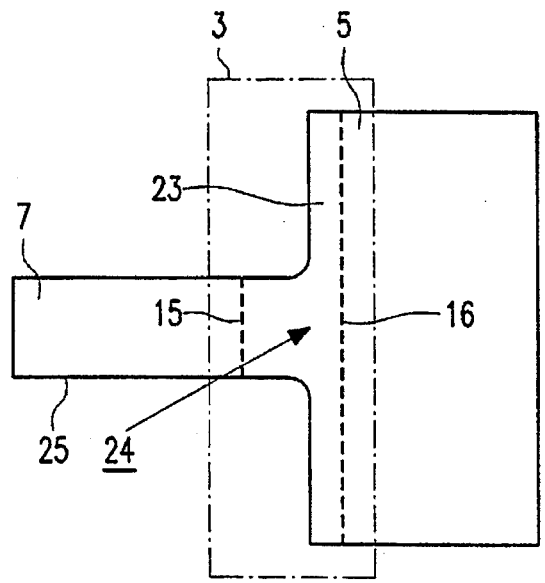
Figure 8:
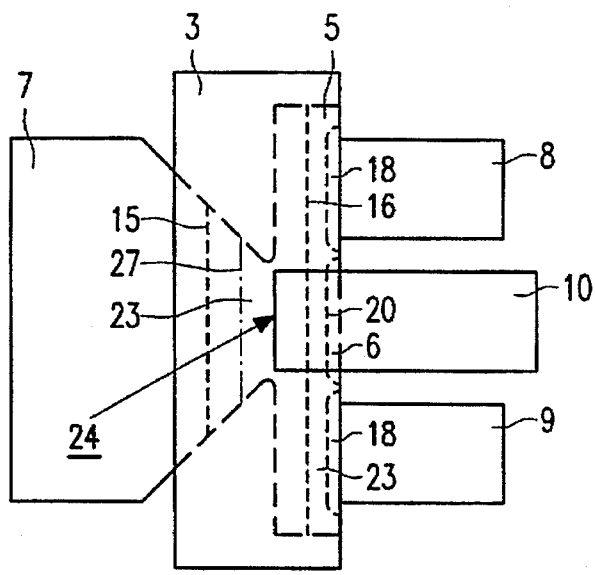
Figure 9:
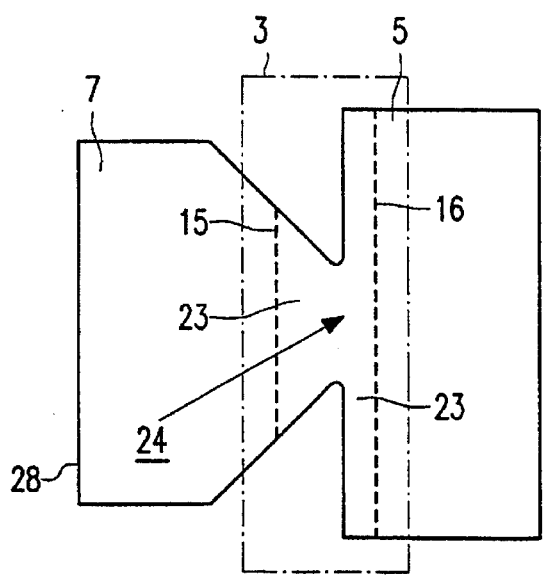

The invention will be explained in more detail below by way of example with reference to a drawing, in which FIGS. 1A, 1B, 2A, 2B, 3A, 3B, 4A and 4B diagrammatically show, both in plan view (A) and in cross-section (B) some consecutive stages in the manufacture of the semiconductor device according to the invention, FIGS. 5A and 5B diagrammatically show, both in plan view (A) and in cross-section (B) an embodiment of the semiconductor device according to the invention with a highly doped extrinsic base, FIG. 6 and FIG. 7 diagrammatically show an embodiment of the semiconductor device according to the invention with a reduced base-collector capacitance, and FIG. 8 and FIG. 9 diagrammatically show an embodiment the semiconductor device according to the invention with a reduced collector series resistance.

DESCRIPTION OF THE INVENTION

FIGS. 1 to 4 diagrammatically show, both in plan view (A) and in cross-section (B), some consecutive stages in the manufacture of a semiconductor device with a bipolar transistor formed in a layer of semiconductor material 2 provided on an insulating substrate 1, in which material a collector zone 4, a base zone 5, and an emitter zone 6 are provided below a strip 3 of insulating material situated on the layer, which zones are connected to contact regions 7, 8, 9, 10 situated adjacent the strip. Three contact regions 8, 9, 10 lie next to one another at a same side of the strip 3, of which two 8 and 9 are connected to the base zone 5, while the third 10 lies between the former two 8 and 9 and is connected to the emitter zone 6.

The insulating substrate 1 may be a plate of glass or a slice of semiconductor material provided with a layer of insulating material such as, for example, a slice of silicon coated with a silicon oxide layer. The layer of semiconductor material may be a monocrystalline or a polycrystalline layer of semiconductor material. When a layer of monocrystalline silicon is provided on an insulating substrate, this is called an SOI structure (Silicon On Insulator structure).

In the present example, the substrate 1 and the layer of semiconductor material 2 present thereon are formed in that a buried layer of silicon oxide is provided in a silicon slice through implantation of oxygen ions. This buried silicon oxide layer and the subjacent portion of the slice form the substrate 1, while the layer of monocrystalline silicon present on the buried silicon oxide layer forms the layer of semiconductor material 2. The buried layer of silicon oxide has a thickness of approximately 400 nm, the layer of semiconductor material 2 a thickness of approximately 200 nm.

First a number of mutually insulated transistor regions 11 are formed in the layer of semiconductor material 2; in the present example these are rectangular regions, but alternative shapes are possible. Only one of these regions is drawn for the sake of clarity. In the example, the layer of semiconductor material 2 is fully removed between the transistor regions 11, but the desired mutual insulation may alternatively be obtained in that the layer 2 is convened into insulating silicon oxide between the transistor regions.

The layer of semiconductor material 2 is subsequently provided with a dopant in usual manner, in this case phosphorus with a concentration of approximately $1 \times 10^{16}$ atoms per cc, after which in usual manner a strip of insulating material is provided, here a layer of silicon oxide with a thickness of approximately 400 nm. The portion of the layer of semiconductor material 2 situated below the strip 3 forms the collector zone 4 of the transistor. A semiconductor device may be realised with transistors having different properties, because their collector zones are differently doped or have different drift regions, in that various transistor regions are given different dopants or in that strips of insulating material of different widths are used.

Figure 1B:
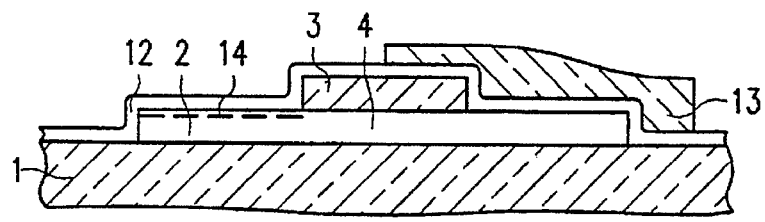
Figure 2:
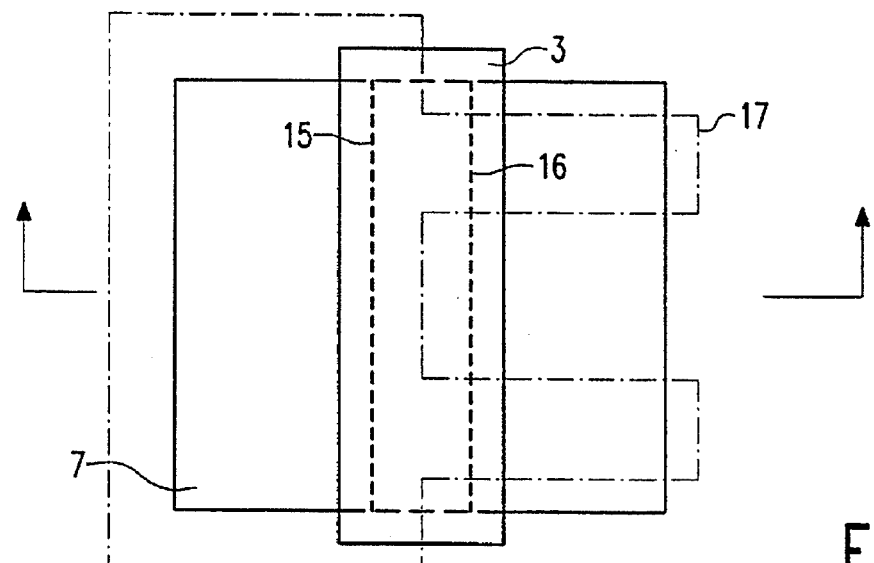
Figure 2:
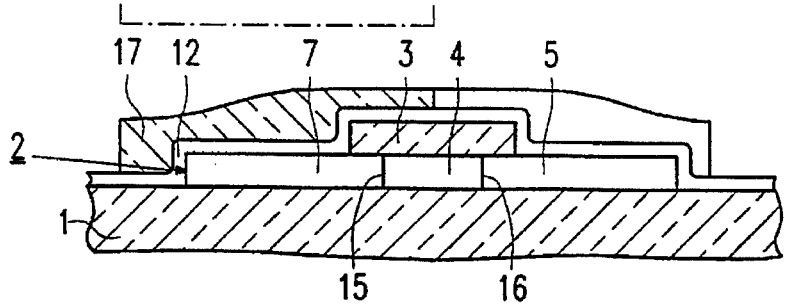
Figure 3A:
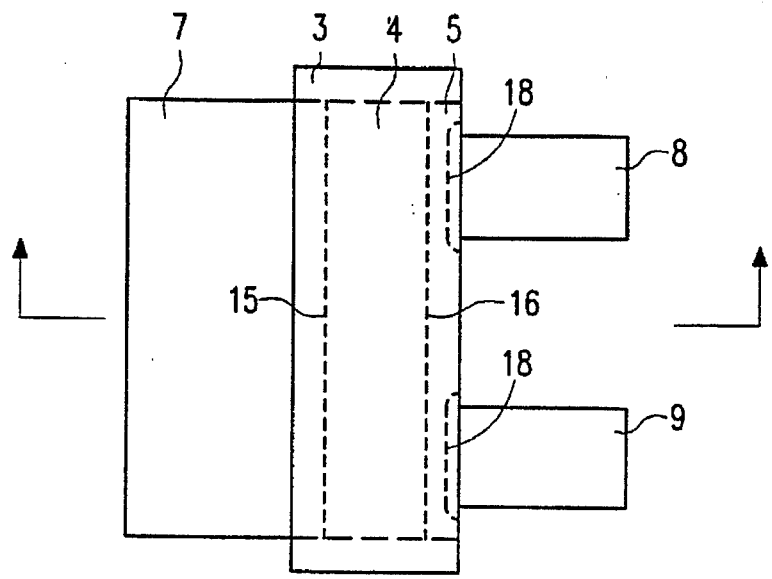
Figure 3B:
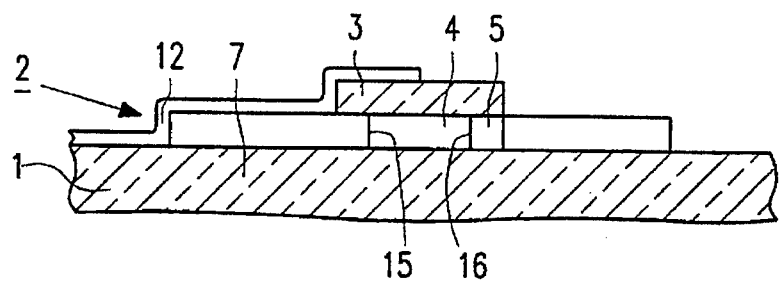
Figure 4A:
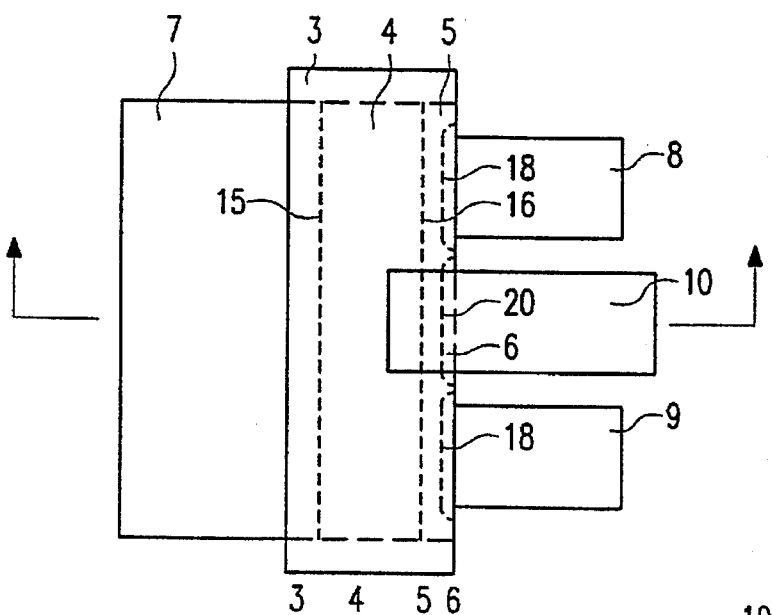
Figure 4B:
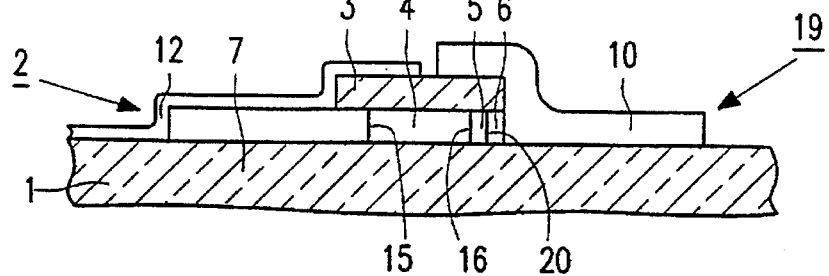

After the strip of insulating material 3 has been provided, an approximately 40 nm thick layer of silicon oxide 12 is deposited over the entire device in usual manner. Then an implantation mask 13 of photoresist is provided, covering the portion of the transistor region 11 situated on the right-hand side of the strip 3 in the Figure. The photoresist mask, which is shown in FIG. 1B in cross-section, is indicated with a dash-dot line in FIG. 1A. Then an ion implantation is carried out, diagrammatically indicated with 14, in which phosphorus ions are provided right through the layer of silicon oxide 12 into the uncovered portion of the layer of semiconductor material 2. After removal of the mask 13, a heat treatment is carried out whereby a contact region 7 connected to the collector zone 4 is formed, extending into the collector zone 4 to below the strip 3 as is diagrammatically indicated with broken in FIG. 2A. The duration of the heat treatment and the temperature at which it is carried out determine how far the contact region 7 will extend below the strip. The contact region 7 has a doping concentration of approximately $5 \times 10^{20}$ atoms per cc.

After the contact region 7 has been formed, boron ions are implanted into the layer of semiconductor material right through the layer of silicon oxide 12, after which a heat treatment is carried out. The p-type dopant as a result diffuses into the portion of the layer of semiconductor material 2 situated below the strip 3. The base zone 5 is thus formed at one side of the strip 3, on the right-hand side in the Figures, forming a base-collector junction 16 with the collector zone 4. The base zone has a doping concentration of approximately $1 \times 10^{18}$ atoms per cc and extends over approximately 300 nm below the strip 3. Boron ions are also implanted into the contact region 7 connected to the collector zone 4, but this region 7 does not change its conductivity type as a result of this.

Two strip-shaped regions 8 and 9 are then formed in the layer of semiconductor material at the same side of the strip 3 from which the base zone 5 was formed. This is done through the application of a photoresist mask 17 in usual manner, drawn in cross-section in FIG. 2B and indicated with a dash-dot line in FIG. 2A, after which the portions of the layer of silicon oxide 12 and of the layer of semiconductor material 2 not covered by the mask 17 are etched away.

After removal of the photoresist mask 17, boron ions are implanted into the layer of semiconductor material 2 right through the layer of silicon oxide 12, after which a heat treatment is carried out. The contact regions 8 and 9 connected to the base zone 5 are formed thereby, indicated diagrammatically with broken line 18, and extending into the base zone 5 to below the strip 3. These contact regions 8 and 9 have a doping concentration of approximately $5 \times 10^{19}$ atoms per cc. Boron ions are again implanted into the contact region 7 connected to the collector zone 4, but again this does not cause the region 7 to change its conductivity type.

The base zone 5 in this example is formed before the contact regions 8 and 9 connected to the base zone 5 are etched into the layer of semiconductor material 2 present on the substrate 1. This order may alternatively be reversed. After the formation of the contact regions 8 and 9 extending below the strip 3 up to the broken line 18, a base zone extending over a distance of approximately 300 nm may alternatively be provided through a usual diffusion from a gas containing boron. This diffusion can also be carried out without the contact region 7 connected to the collector zone 4 changing its conductivity type.

After the contact regions 8 and 9 have been formed, a further layer of semiconductor material 19, such as amorphous or polycrystalline silicon, with a thickness of approximately 400 nm is provided in usual manner over the assembly thus formed. Arsenic ions are implanted into this further layer, after which a strip-shaped region 10 situated between the contact regions 8 and 9 connected to the base zone 5 is formed in usual manner in a photolithographic process. For this purpose, a photoresist mask having dimensions corresponding to those of the region 10 to be formed is provided on the further arsenic-doped layer, after which the portion of the layer not covered by the photoresist mask is etched away. The silicon oxide layer 12 still present on the contact region 7 connected to the collector zone 4, on the strip 3 and on the contact regions 8 and 9 connected to the base zone serves as an etching stopper layer during this. After the strip-shaped region 10 has been formed, a heat treatment is carried out whereby arsenic diffuses from the region 10 into the portion of the layer of semiconductor material 2 situated below the strip 3. The emitter zone 6 is thus formed, making an emitter-base junction 20 with the base zone 5. The emitter zone has a doping concentration of approximately $5 \times 10^{20}$ atoms per cc and extends over approximately 150 nm below the strip 3.

In the device according to the invention, the three contact regions 8, 9, 10 situated next to one another at the same side of the strip 3 are provided alternately in the layer of semiconductor material 2 and in a further layer of semiconductor material 19 which extends up to the strip 3.

The contact regions 8, 9, 10 connected to the base zone 5 and to the emitter zone 6 are manufactured in two photolithographic process steps. In the first process step, a first pattern is provided in the layer of semiconductor material 2 present on the substrate. Then the further layer of semiconductor material is deposited, and a second pattern is provided therein during the second process step. When the first pattern comprises the base-contact regions 8 and 9, as described above, the second pattern will comprise the emitter contact region 10. The contact regions 8, 9, 10 are thus provided alternately in the layer of semiconductor material 2 present on the substrate and in the further layer of semiconductor material 19. Although this is not shown in the drawing, the first pattern may comprise the emitter contact region and the second pattern the base contact regions. In that case the contact regions 8, 9, 10 are also provided alternately in the layer 2 and in the further layer 19. The ensuing descriptions are equally valid for the case not shown in the drawings and for the case shown in the drawings.

In the second photolithographic process step, a photoresist mask of the same lateral dimensions as the contact region 10 is provided and aligned relative to the first pattern, consisting of the contact regions 8 and 9, realised during the first process step. It is true for a photolithographic process that details smaller than a critical dimension valid for that process cannot be pictured in photoresist. The alignment of two photoresist masks relative to one another can be achieved with an alignment tolerance which is much smaller than this critical dimension. In a photolithographic process having a critical dimension of 0.5 µm, by which details of 0.5 µm can be realised in a photoresist mask, this alignment tolerance in practice is approximately 0.1 µm. If the contact regions were all realised in one and the same photolithographic process, for example, in the layer of semiconductor material 2, their mutual interspacings would have to be at least 0.5 µm. In the device according to the invention, in which two photolithographic process steps are used, this is no more than 0.1 µm. The portion of the base zone 5 lying between the emitter zone 6 and the collector zone 4 forms the intrinsic base of the transistor, while the portion lying between the intrinsic base and the contact regions 8 and 9 connected to the base zone 5 forms the extrinsic base. The extrinsic base in the present example thus comprises two strips of the base zone 5 with a length of 0.1 µm.

As was noted above for the three contact regions 8, 9 and 10, either the contact regions 8, 9 connected to the base zone or the contact region 10 connected to the emitter zone may be provided in the layer of semiconductor material 2 present on the insulating substrate 1. The other contact region 10 or the other contact regions 8 and 9, as the case may be, is/are then provided in the further layer of semiconductor material. Preferably, however, according to the invention, the contact regions 8 and 9 connected to the base zone are provided in the layer of semiconductor material 2 present on the substrate 1, while the contact region 10 connected to the emitter zone 6 is provided in the further layer of semiconductor material.

The emitter zone 6 in this preferred embodiment of the transistor is formed through lateral diffusion of dopant atoms from the further layer of semiconductor material 19 into the layer of semiconductor material 2 provided on the substrate. Thus an emitter-base junction 20 can be realised which is situated in the base zone 5 over a very small distance only, here approximately 150 nm, while nevertheless a very efficient emitter is obtained. This high efficiency is obtained because the layer of semiconductor material 2 provided on the substrate merges into the further layer of semiconductor material 19 very close to the emitter-base junction 20.

The contact region 7 connected to the collector zone 4 may be formed in the layer of semiconductor material 2 provided on the insulating substrate 1 or in the further layer of semiconductor material. Preferably, according to the invention, this contact region 7 is provided in the layer of semiconductor material 2 at the other side of the strip 3 of insulating material opposite the contact region 10 connected to the emitter zone 6. The strip of insulating material 3 may then be provided on the layer of semiconductor material 2 to a width equal to the critical dimension mentioned above which can be realised in the lithographic process used. As a result, the collector drift region of the transistor situated between the broken lines 15 and 16 has minimum dimensions. If the contact region connected to the collector zone were provided in the further layer of semiconductor material, it could not be positioned so favorably. The contact regions connected to the collector zone 4 and the emitter zone 5 would then have to be positioned with mutual interspacings of at least the said critical dimension. The strip of insulating material 3 would then have to be wider than this critical dimension. If the critical dimension is 0.5 µm and the alignment tolerance 0.1 µm, as described above, the strip in the one case would have to be 0.5 µm wide and in the other case 0.7 µm wide.

As noted above, the extrinsic base, i.e. that portion of the base zone 5 which lies between the contact regions 8, 9 connected to the base zone 5 on the one hand and the intrinsic base between the emitter-base junction 20 and the base-collector junction 16 on the other hand, forms an undesirable resistance. This resistance is reduced in the embodiment of the semiconductor device shown in FIG. 5. According to the invention, strongly boron-doped zones 23 are formed in the base zone 5 between the three contact regions 8, 9, 10 situated at the same side of the strip 3. For this purpose, strips 21 of boron-doped insulating material are provided, from which the zones are formed through diffusion. These strips 21 are formed in that the transistor shown in FIG. 4 is covered in usual manner with a borosilicate glass layer 22, indicated with a broken line, and an isotropic etching treatment is subsequently carried out and continued so long until the strip 3 and the contact regions 7, 8, 9, 10 are exposed again. The strips 21 interposed between the contact regions 8, 9, 10 remain then. In a subsequent heat treatment, boron is diffused from the strips 21 into the base zone 5, so that the zones 23 are formed in the base zone. The resistance is reduced by the zones 23.

The transistors shown in FIGS. 4 and 5 show a comparatively high base-collector capacitance. A further preferred embodiment of the transistor shows a strongly reduced base-collector capacitance. In the transistor, which is shown in FIG. 6, the collector zone 23 has a constriction 24 below the strip of insulating material 3 with a width which is substantially equal to that of the emitter zone 6. This transistor is manufactured starting with a transistor region 25 which already has the constriction 24. FIG. 7 shows the transistor region 25 in which the contact region 7 connected to the collector zone 23 and the base zone 5 have already been provided. The strip of insulating material 3 in FIG. 7 is indicated with a dash-dot line for greater clarity. The constriction in this example has a width of approximately 0.5 µm. A major portion of the collector zone 23 is depleted during operation of this transistor. Seen from the emitter zone 6, the depletion region extends to beyond the constriction 24, as is indicated in FIG. 6 with a dash-dot line 26. The base-collector capacitance is accordingly determined by the width of the constriction 24, which is 0.5 µm, so much smaller than the width of the base-collector junction 16, which is approximately 1.9 µm. In the transistors shown in FIGS. 4 and 5, the base-collector capacitance is determined by the full width of the base-collector junction.

Since the collector zone is much narrower than that of the transistors shown in FIGS. 4 and 5, the transistor shown in FIG. 6 has a comparatively high collector series resistance. FIG. 8 shows a further preferred embodiment of the transistor in which the collector zone 23, seen from the emitter zone 6 in the direction of the contact region 7 connected to the collector zone 23, widens again beyond the constriction 24. The transistor of FIG. 8 is manufactured starting from a transistor region 28 which widens out again beyond the constriction 24. FIG. 9 shows the transistor region 28 in which the contact region 7 connected to the collector zone 23 and the base zone 5 have already been provided. The strip of insulating material 3 in FIG. 9 is indicated with a dash-dot line for greater clarity. The constriction in this example has a width of approximately 0.5 µm. A major portion of the collector zone 23 is depleted during operation of this transistor. Seen from the emitter zone 6, the depletion region extends to beyond the constriction 24, as is shown with a dash-dot line 27 in FIG. 8. The base-collector capacitance is substantially the same as that of the transistor shown in FIG. 7 and is mainly determined by the width of the constriction 24 also in this transistor. Since the collector zone widens out beyond the constriction 24, the collector series resistance of this transistor is lower than that of the transistor shown in FIG. 6, and substantially the same as that of the transistors shown in FIGS. 4 and 5.

The contact regions 7, 8, 9, 10 may be provided with a top layer consisting of a metal silicide, such as titanium disilicide, if so desired. After remainders of the silicon oxide layer 12 have been removed, a titanium layer is provided in that case, after which a heat treatment in nitrogen is carried out and an etching treatment is carded out whereby titanium and reaction products of titanium and nitrogen are removed. The contact regions 7, 8, 9, 10 are thus provided with a titanium silicide top layer in a self-aligning manner.

To complete the transistors, it is only necessary to provide a layer of insulating material (not shown), such as silicon oxide, to etch contact windows into this layer of insulating material, partly exposing the contact regions 7, 8, 9, 10, and to provide a metallization on the layer of insulating material for contacting the contact regions 7, 8, 9, 10. The transistors described above show current amplification factors of more than 100 for signals having frequencies of approximately 10 GHz for collector currents below 1 µA already.

We claim:

1. In a semiconductor device having a bipolar transistor formed in a layer of semiconductor material on an insulating substrate, said bipolar transistor having a collector zone, a base zone and an emitter zone disposed in said layer of semiconductor material, said semiconductor device also having a strip of insulating material disposed on said layer above said collector zone, said base zone and said emitter zone, and contact regions adjacent to one another at one side of said strip, two of said contact regions being connected to said base zone and a third of said contact regions being disposed between said two contact regions and being connected to said emitter zone, the improvement comprising:

a further layer of semiconductor material different from said layer of semiconductor material, said further layer of semiconductor material being disposed on said insulative substrate, butting said layer of semiconductor material at said one side of said strip of insulating material, and further extending over a portion of said strip of insulating material at said one side, (i) one of either said third contact region or said two contact regions being disposed in said layer of semiconductor material and (ii) the other one of either said contact region or said two contact regions being disposed in said further layer of semiconductor material and being comprised of either a strip-shaped region or strip-shaped regions, respectively.

2. A semiconductor device according to claim 1, wherein said two of said contact regions connected to said base zone are disposed in said layer of semiconductor material, and wherein said third contact region connected to said emitter zone is disposed in said further layer of semiconductor material.

3. A semiconductor device according to claim 2, wherein a fourth contact region is disposed in said layer of semiconductor material at a second side of said strip of insulating material, said fourth contact region being connected to said collector zone and being disposed opposite to said third contact region.

4. A semiconductor device according to claim 3, wherein strongly doped zones are disposed in said base zone between said three contact regions.

5. A semiconductor device according to claim 3, wherein said collector zone has a constricted width below said strip of insulating material, said constricted width being substantially equal to width of said emitter zone.

6. A semiconductor device according to claim 5, wherein said collector zone widens out from said constricted width in a direction beyond said strip.

7. A semiconductor device according to claim 1, wherein a fourth contact region is disposed in said layer of semiconductor material at a second side of said strip of insulating material, said fourth contact region being connected to said collector zone and being disposed opposite to said third contact region.

8. A semiconductor device according to claim 1, wherein strongly doped zones are disposed in said base zone between said three contact regions.

9. A semiconductor device according to claim 1, wherein said collector zone has a constricted width below said strip of insulating material, said constricted width being substantially equal to width of said emitter zone.

10. A semiconductor device according to claim 9, wherein said collector zone widens out from said constricted width in a direction beyond said strip.

* * * * *